US010595417B2

(12) United States Patent
Pepin et al.

(10) Patent No.: US 10,595,417 B2
(45) Date of Patent: Mar. 17, 2020

(54) METHOD OF MANUFACTURING FLEXIBLE ELECTRONIC CIRCUITS HAVING CONFORMAL MATERIAL COATINGS

(71) Applicant: Verily Life Sciences LLC, Mountain View, CA (US)

(72) Inventors: Brian Marc Pepin, Oakland, CA (US); Bo Lu, Fremont, CA (US)

(73) Assignee: Verily Life Sciences LLC, Mountain View, CA (US)

( * ) Notice: Subject to any disclaimer, the term of this patent is extended or adjusted under 35 U.S.C. 154(b) by 393 days.

(21) Appl. No.: 15/212,739

(22) Filed: Jul. 18, 2016

(65) Prior Publication Data

US 2018/0020546 A1   Jan. 18, 2018

(51) Int. Cl.
*H05K 3/28* (2006.01)
*H01L 23/498* (2006.01)
(Continued)

(52) U.S. Cl.
CPC .............. *H05K 3/28* (2013.01); *H01L 21/48* (2013.01); *H01L 21/4867* (2013.01);
(Continued)

(58) Field of Classification Search
CPC .......... H05K 1/182; H05K 1/028; H05K 3/22; H05K 3/32; H01L 21/48; H01L 21/4867;
(Continued)

(56) References Cited

U.S. PATENT DOCUMENTS 5,409,733 A    4/1995 Boger et al.
5,755,913 A  *  5/1998 Liaw .................. B32B 37/0038
                                                    156/272.6

(Continued)

FOREIGN PATENT DOCUMENTS

EP    2 374 335 A1    10/2011
RU    2556697          7/2015
(Continued)

OTHER PUBLICATIONS

International Search Report and Written Opinion of the International Searching Authority from International Application No. PCT/US2017/039089, dated Oct. 10, 2017.
(Continued)

*Primary Examiner* — Peter Dungba Vo
*Assistant Examiner* — Azm A Parvez
(74) *Attorney, Agent, or Firm* — McDonnell Boehnen Hulbert & Berghoff LLP

(57) ABSTRACT

A method of manufacturing a flexible electronic circuit is provided. The method may include forming a positive photoresist mold on a flexible polymer substrate having a plurality of metal traces. The method may also include applying a conformal material coating over the positive photoresist mold, the flexible polymer substrate, and the metal traces. The method may further include removing an excess of the conformal material coating by running a blade over the positive photoresist mold. The method may also include removing the positive photoresist mold to reveal a cavity defined by the conformal material coating. The method may further include dispensing an anisotropic conductive paste into the cavity and inserting a chip into the cavity and bonding the chip to the metal traces.

16 Claims, 7 Drawing Sheets

(51) Int. Cl.
*H01L 21/48* (2006.01)
*H05K 3/32* (2006.01)
*H05K 1/18* (2006.01)
*H01L 21/56* (2006.01)
*H01L 23/31* (2006.01)

(52) U.S. Cl.
CPC .......... *H01L 21/56* (2013.01); *H01L 23/4985* (2013.01); *H05K 1/189* (2013.01); *H05K 3/323* (2013.01); *H01L 21/4803* (2013.01); *H01L 23/3121* (2013.01); *H05K 2201/09909* (2013.01); *H05K 2201/10151* (2013.01); *H05K 2203/0139* (2013.01); *H05K 2203/0195* (2013.01); *H05K 2203/0292* (2013.01); *H05K 2203/0769* (2013.01); *H05K 2203/0783* (2013.01); *H05K 2203/0793* (2013.01); *H05K 2203/308* (2013.01)

(58) Field of Classification Search
CPC ................... H01L 21/4803; H01L 23/4985; H01L 25/065
USPC .............................. 29/832, 825, 829, 592.1
See application file for complete search history.

(56) References Cited

U.S. PATENT DOCUMENTS

| | | | |
|---|---|---|---|
| 6,136,243 A | | 10/2000 | Mehregany et al. |
| 6,232,563 B1 * | | 5/2001 | Kim .................. H01L 23/49816 174/261 |
| 6,472,459 B2 | | 10/2002 | Morales et al. |
| 6,841,339 B2 | | 1/2005 | Morales |
| 7,088,005 B2 | | 8/2006 | Lee |
| 7,109,107 B2 | | 9/2006 | Prather et al. |
| 8,156,644 B2 | | 4/2012 | Babb et al. |
| 8,399,268 B1 * | | 3/2013 | Mei .................. H01L 33/50 257/E21.032 |
| 2005/0032272 A1 | | 2/2005 | Prather et al. |
| 2008/0117619 A1 | | 5/2008 | Pang et al. |
| 2011/0171392 A1 | | 7/2011 | Gambino et al. |
| 2012/0006464 A1 | | 1/2012 | Van Den Brand et al. |
| 2012/0305306 A1 | | 12/2012 | Zinn |
| 2013/0105980 A1 | | 5/2013 | Yasuda et al. |
| 2015/0090960 A1 | | 4/2015 | Ma et al. |
| 2016/0163622 A1 * | | 6/2016 | Liang .................. H01L 25/50 257/676 |
| 2016/0351482 A1 | | 12/2016 | Zhang et al. |

FOREIGN PATENT DOCUMENTS

| | | |
|---|---|---|
| RU | 2580512 | 4/2016 |
| WO | WO2008/103558 A1 | 8/2008 |
| WO | WO-2015018143 A1 * | 2/2015 |

OTHER PUBLICATIONS

Sterken et al., "Ultra-Thin Chip Package UTCP) and stretchable circuit technologies for wearable ECG system", Engineering in Medicine and Biology Society, EMBC, 2011 Annual International Conference of the IEEE, Aug. 30, 2011, pp. 6886-6889.

* cited by examiner

METHOD OF MANUFACTURING FLEXIBLE ELECTRONIC CIRCUITS HAVING CONFORMAL MATERIAL COATINGS

BACKGROUND

Technical Field

The present disclosure relates generally to the field of flexible electronic circuits, and more particularly, methods of manufacturing flexible electronic circuits having conformal material coatings.

Background Description

Flexible electronic circuits continue to evolve as materials and manufacturing techniques are developed. Flexible electronic circuits utilize flexible substrates that can be adapted into specific form-factors to meet the needs of an application. Chips may be flip-chip bonded directly onto the flexible substrate and a conformal material coating may be applied to provide mechanical and moisture ingress protection. For some flexible electronic circuits it is necessary to leave one or more of the chips exposed to the external environment. For example, some flexible electronic circuits may have a sensor chip that needs to be exposed to the external environment in order to function properly. To accommodate this requirement, different techniques have been developed to either remove the conformal material coating from the sensor chip or the sensor chip has to be masked during the coating process. For example, ablating the conformal material coating from the surface of the sensor chip and masking of the sensor chip have both been tried. Although these techniques make it possible to leave a portion of the sensor chips exposed, there is a need for a more consistent and reliable methods that will not compromise the sensor chip during the process. In addition, as the demand for smaller and smaller flexible electronic circuits continues to increase, the need to control the size (e.g., thickness) of all portions of the flexible electronics, including the conformal material coating, will continue to increase. For some flexible electronic circuits it can be difficult to precisely control the thickness of the conformal material coating. For example, depending on the material and the method of application the thickness of the conformal material coating can be excessive and thus unnecessarily adds to the overall thickness of the flexible electronic circuit. Therefore, there is also a need for a method that enables more precise control over the thickness of the conformal material coating.

SUMMARY

In one aspect, the present disclosure is directed to a method of manufacturing a flexible electronic circuit. The method may include forming a positive photoresist mold on a flexible polymer substrate having a plurality of metal traces. The method may also include applying a conformal material coating over the positive photoresist mold, the flexible polymer substrate, and the metal traces. The method may further include removing an excess of the conformal material coating by running a blade across the conformal material coating, over the positive photoresist mold. The method may also include removing the positive photoresist mold to reveal a cavity defined by the conformal material coating. The method may further include dispensing an anisotropic conductive paste into the cavity and inserting a chip into the cavity and bonding the chip to the metal traces.

In another aspect, the present disclosure is directed to another method of manufacturing a flexible electronic circuit. The method may include pressing a screen onto a flexible polymer substrate having a plurality of metal traces, wherein the screen has a porous portion and a blocked portion, and the blocked portion defines a mold. The method may also include applying a conformal material coating to the top of the screen enabling the conformal material to flow through the porous portion of the screen filling around the mold. The method may further include driving the conformal material coating through the screen and removing an excess of the conformal material from the screen by running a blade over the screen. The method may also include removing the screen to reveal a cavity defined by the conformal material coating. The method may further include dispensing an anisotropic conductive paste into the cavity and inserting a chip into the cavity and bonding the chip to the metal traces.

In another aspect, the present disclosure is directed to a flexible electronic circuit. The flexible electronic circuit may include a flexible substrate having a plurality of metal traces. The flexible electronic circuit may also include a conformal material coating, which defines at least one cavity. The flexible electronic circuit may further include a first chip bonded into the at least one cavity. The flexible electronic circuit may also include an anisotropic conductive paste that surrounds the first chip within the at least one cavity. At least one surface of the first chip may be exposed to the surrounding environment and the conformal material coating has a thickness that is less than or equal to a thickness of the first chip.

DETAILED DESCRIPTION

Reference will now be made in detail to embodiments of the present disclosure, examples of which are illustrated in the accompanying drawings. Where possible, the same reference numbers will be used throughout the drawings to refer to the same or like parts.

Figure 1:
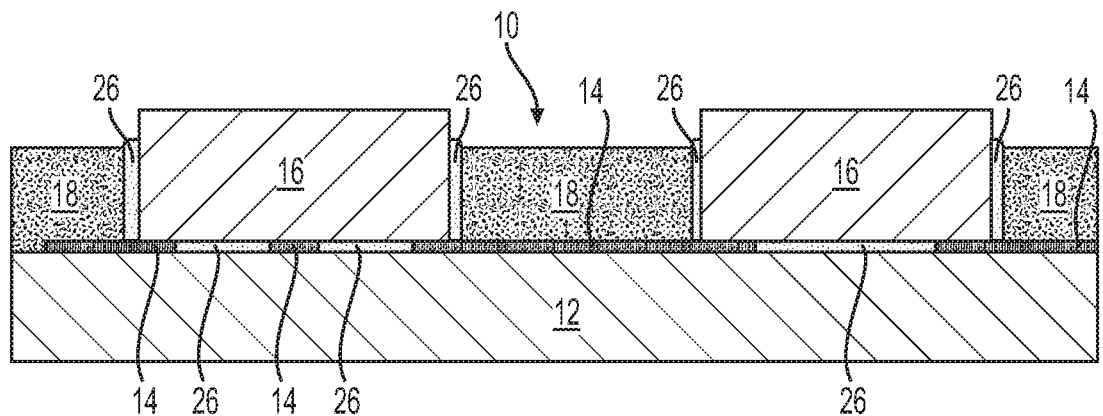
FIG. 1 is a cross-sectional illustration of a flexible electronic circuit, according to an exemplary embodiment.

FIG. 1 shows a cross-sectional illustration of a flexible electronic circuit (FEC) 10. FEC 10 may include a flexible substrate 12 having a plurality of metal traces 14. FEC 10 may also include one or more chips 16 attached to metal traces 14. FEC 10 may also have a conformal material coating 18 applied over flexible substrate 12 and may be applied over at least a portion of metal traces 14. Conformal material coating 18 may define one or more cavities in which chips 16 may be inserted. FEC 10 may also have an anisotropic conductive paste 20.

Flexible substrate 12 may be formed of a variety of materials. For example, flexible substrate may be formed of polyethylene terephthalate (PET), polyimides (PI), or liquid crystal polymer (LCP). In some embodiments, flexible substrate 12 may be formed of a flexible film on a rigid carrier wafer. Metal traces 14 may be applied to flexible substrate 12 by any suitable means. Metal traces 14 may be formed of a variety of materials. For example, metal traces 14 may be formed of gold, copper, aluminum, or other suitable material, and in some embodiments the metal traces 14 may have an electroplated finish.

FEC 10 may be manufactured such that at least chip 16 may have a portion exposed to the external or surrounding environment. For example, as shown in FIG. 1, the upper surfaces of chips 16 may be exposed to the external environment. For some applications, it may be advantageous and/or a requirement of FEC 10 design to have at least one chip 16 exposed to the environment. For example, chip 16 may be a sensor chip that needs to be exposed to the environment in order to function properly. For example, in some embodiments, chip 16 may be a sensor chip designed to measure a value of the surrounding environment. For example, chip 16 may be an electrochemical sensor (e.g., for glucose measurement), a pressure sensor (e.g., intraocular pressure (IOP)), optical sensor, moisture sensor, or volatile organic compounds (VOCs), or other sensor that measures a characteristic of the environment. In some embodiments, it may be advantageous or otherwise desirable for FEC 10 design to have at least one chip 16 exposed in order to enable interconnection to another chip. For example, the exposed chip may be connected to another chip or component in a stacked multilayer circuit. The connection may be made, for example, via a flexible conductive adhesive, a wire bond, or a direct metallization connection.

Figure 2A:
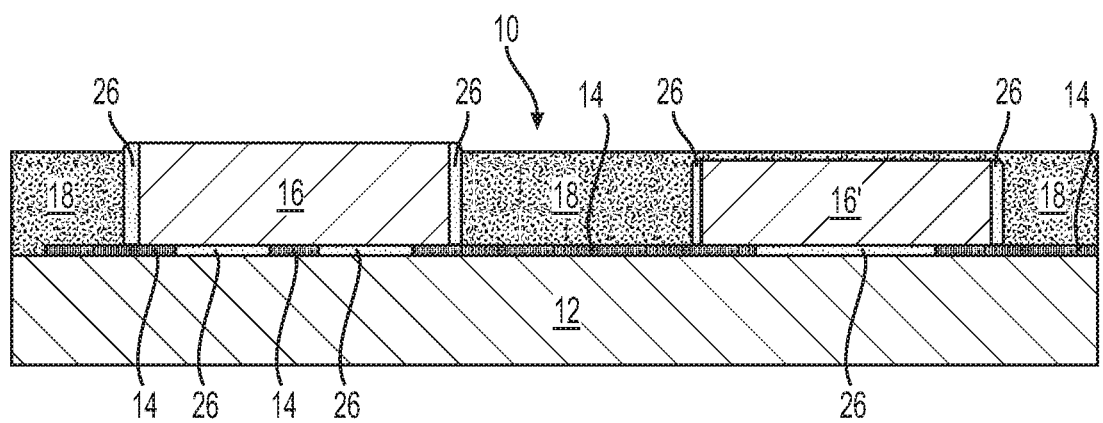
FIG. 2A is a cross-sectional illustration of a flexible electronic circuit, according to another exemplary embodiment.

In some embodiments, as shown in FIG. 2A, FEC 10 may include a plurality of different chips 16. One or more of chips 16 may be exposed to the environment while one or more of chips 16' may be completely coated with conformal material coating 18. In some embodiments, chip 16 may protrude above the surface of CMC 18 such that CMC 18 has a thickness less than or equal to a thickness of chip 16, as shown in FIG. 1. In some embodiments, chip 16 may be generally flush with the surface of CMC 18, as shown in FIG. 2A. The dimensions (e.g., length, width, and thickness) of chips 16 may vary. For example, in some embodiments the length of chips 16 may be about 500 um, about 600 um, about 700 um, about 800 um, about 900 um, about 1 mm, about 1.1 mm, about 1.2 mm, about 1.3 mm, about 1.4 mm, about 1.5 mm, or greater than about 1.5 mm. In some embodiments, the width of chips 16 corresponding to the lengths listed above may be, for example, about 500 um, about 600 um, about 700 um, about 800 um, about 900 um, about 1 mm, about 1.1 mm, about 1.2 mm, about 1.3 mm, about 1.4 mm, about 1.5 mm, or greater than about 1.5 mm.

The thickness of chip 16 for any combination of length and width listed above may be, for example, about 30 um, about 40 um, about 50 um, about 60 um, about 70 um, about 80 um, about 90 um, about 100 um, about 110 um, about 120 um, about 130 um, about 140 um, about 150 um, or greater than about 150 um. As shown in FIG. 1, in some embodiments the thickness of chips 16 may be equal while the thickness of chip 16 and chip 16' in FIG. 2A may be different.

Figure 2B:
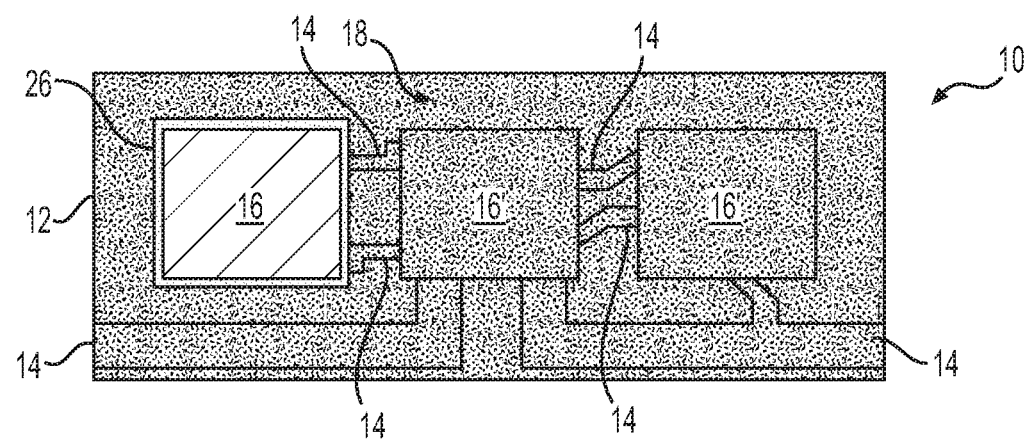
FIG. 2B is a top view illustration of a flexible electronic circuit, according to another exemplary embodiment.

FIG. 2B shows another exemplary embodiment of FEC 10. FEC 10 may have three chips installed on substrate 12 interconnected by metal traces 14. Chips 16' may be covered by CMC 18 while chip 16 may be a sensor type chip where the top surface may be exposed to the environment (i.e., not covered by CMC 18), as shown in FIG. 2B.

A plurality of methods of manufacturing FEC 10 will be described herein, according to exemplary embodiments.

Figure 3:
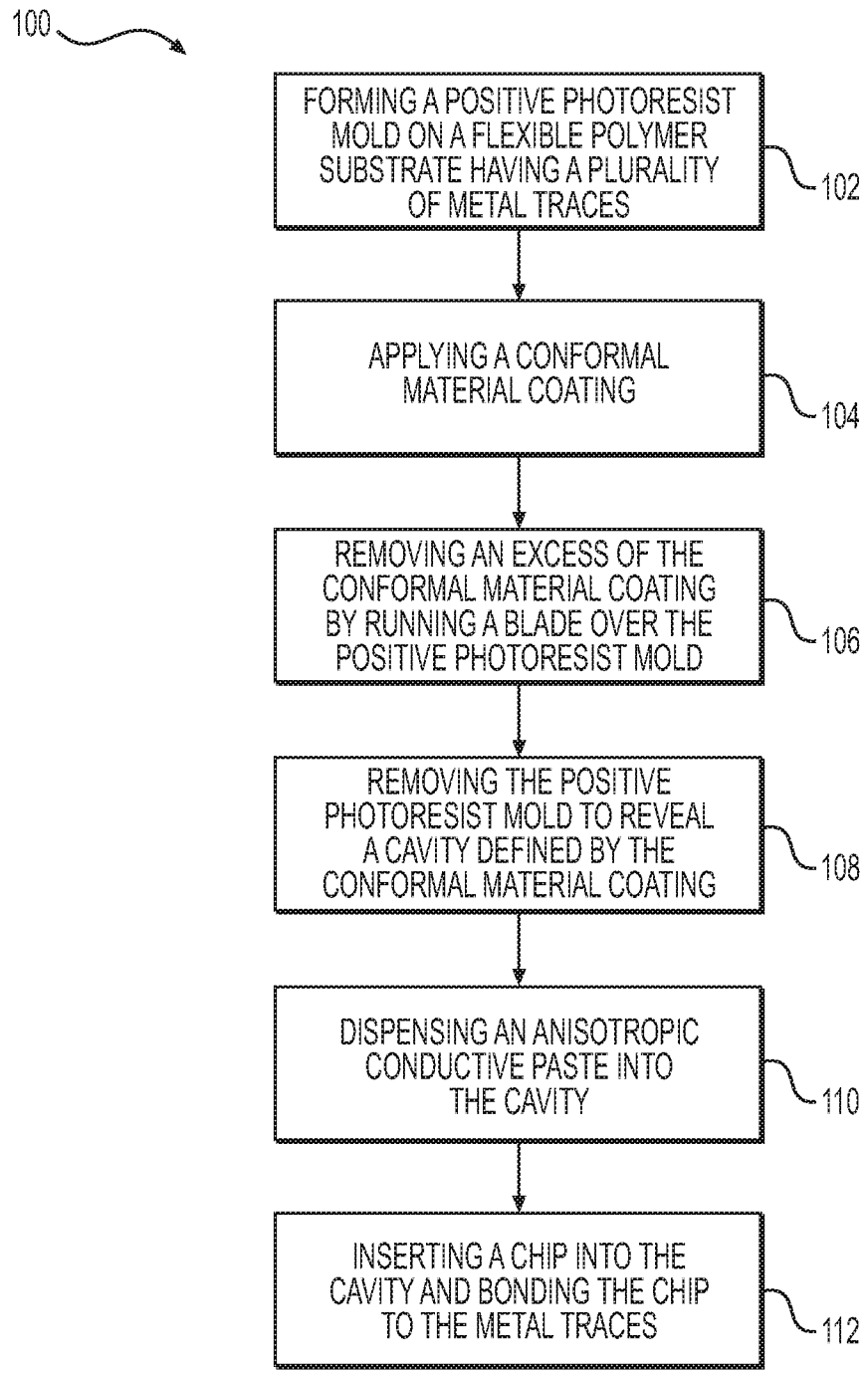
FIG. 3 is a flow chart illustrating a method of manufacturing the flexible electronic circuit of FIG. 1.
Figure 4:
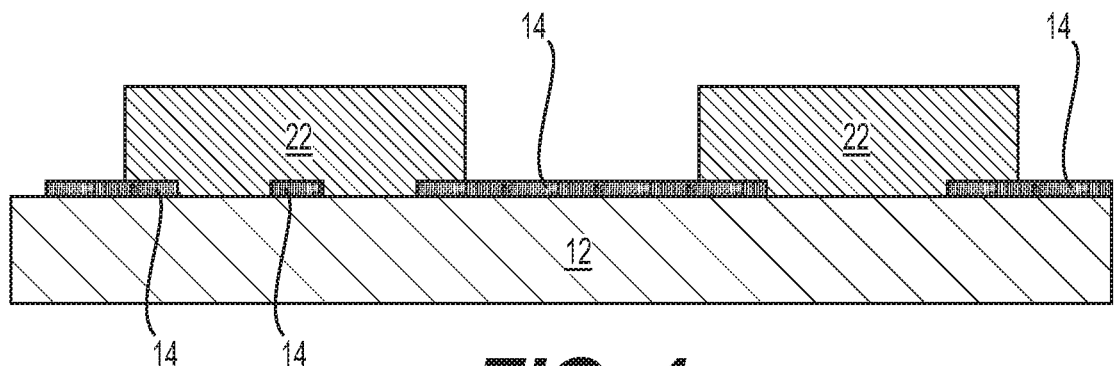
FIG. 4 is a cross-sectional illustration of a step of the method of manufacturing of FIG. 3.

A first method 100 of manufacturing FEC 10 will now be explained with reference to FIGS. 3-8. FIG. 3 is a flow chart showing the steps of method 100. Method 100 may begin with flexible polymer substrate 12 having metal traces 14. Step 102 may include forming a positive photoresist mold 22 on flexible polymer substrate 14. For example, as shown in FIG. 4, one or more photoresist molds 22 may be formed on top of flexible polymer substrate 12 and metal traces 14. Photoresist molds 22 may be formed, for example, by spin coating and lithography. In some embodiments, photoresist molds 22 may be dry-film. The photoresist molds 22 may conform to the pattern of metal traces 14.

Next, at step 104, method 100 may include applying CMC 18 over the positive photoresist molds 22, flexible polymer substrate 12, and a portion of the metal traces 14. According to an exemplary embodiment, CMC 18 may be a silicone adhesive rubber. In some embodiments, other suitable materials may be used for CMC 18. For example, acrylic, urethane, acrylated urethane, soft epoxies, or cyclic olefin copolymers. In some embodiments, prior to 104, an oxygen plasma treatment may be conducted on the surface of substrate 12. The oxygen plasma treatment may create hydroxyl groups on the polymer surface. The oxygen plasma treatment may improve adhesion of CMC 18.

Figure 5:
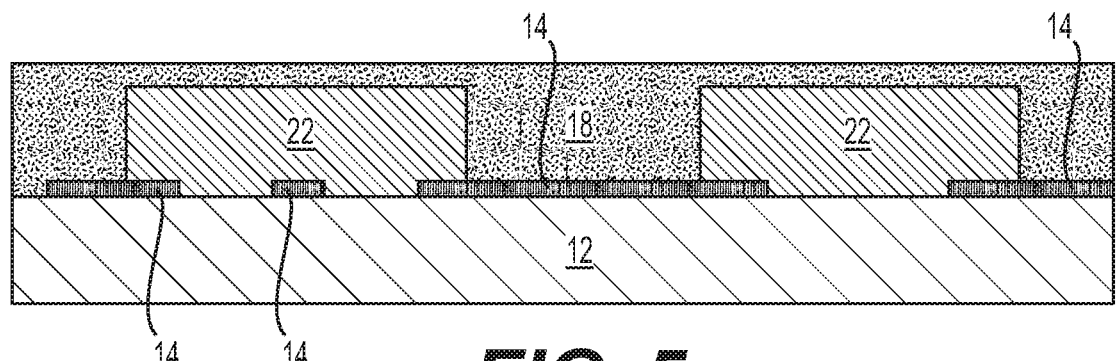
FIG. 5 is a cross-sectional illustration of another step of the method of manufacturing of FIG. 3.

CMC 18 may be applied utilizing a variety of suitable methods. For example, CMC 18 may be applied by spin coating, spray coating, dip coating, or slot-die coating. Other suitable methods may also be used or a combination of methods may be used. According to an exemplary embodiment, CMC 18 may be applied using the spin coating method. A sufficient quantity of CMC 18 may be applied. For example, as shown in FIG. 5, CMC 18 may cover both photoresist molds 22 and fill the space between the adjacent positive photoresist molds 22.

Figure 6:
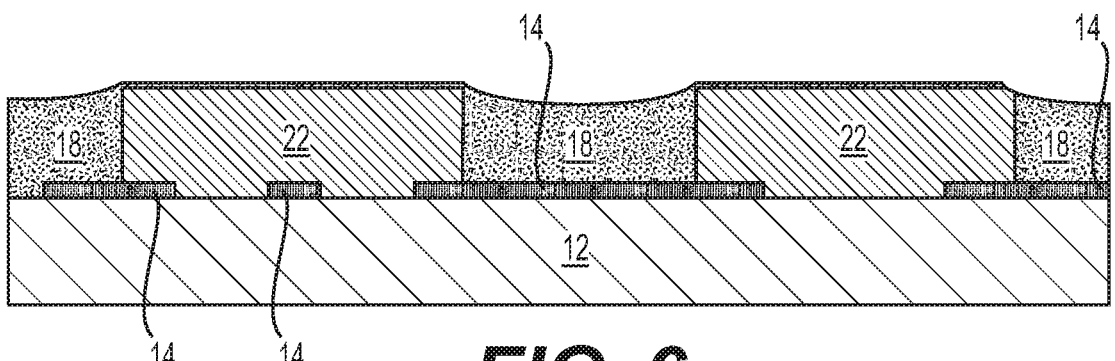
FIG. 6 is a cross-sectional illustration of another step of the method of manufacturing of FIG. 3.

Next at step 106, method 100 may include removing an excess of the CMC 18 by running a blade across CMC 18 over positive photoresist molds 22. The blade may be controlled to run over one, some or all positive photoresist molds 22. The excess may be defined as a portion of or all CMC 18 that sits at an elevation above positive photoresist molds 22. As shown in FIG. 6, in some embodiments there may be a thin layer of residual or residue CMC 18 left on the top of photoresist molds 22. In addition to removing the excess that sits on top of positive photoresist molds 22, running the blade may also remove the excess between the photoresist molds 22. For example, as shown in FIG. 6, the excess between photoresist molds 22 may be removed. In some embodiments, a recess may be formed due to the additional removal of CMC 18 as a result of the viscosity of CMC 18.

In some embodiments, the blade used at step 104 for removing the excess CMC 18 may be a squeegee-like blade having an a generally smooth edge. The blade may be formed of elastomer and may be at least partially deflectable dependent on the application of forces. The blade may be manually or automatically controlled. For example, in some embodiments a robotic system may control the blade. A variety of different aspects or settings of the blade control may be adjustable and controllable. For example, the elevation of the blade relative to the surface of photoresist molds 22 or surface of substrate 12. Adjusting the elevation of the blade relative to the surface of photoresist molds 22 or the surface of substrate 12 may enable precise control over the thickness of CMC 18. In yet another example, the angle of the blade and/or the pressure (i.e., downward force) being applied by the blade may be controllable. The direction, speed, path of the blade run, and number of passes may also be controllable in some embodiments. In some embodiments, the blade may be run just one time while in other embodiments the blade may be run multiple times. For embodiments where the blade is run multiple times the setting of the blade control may be adjusted. For example, a first run of the blade may be used to get the majority of the excess CMC 18 while a second run of the blade is done at an increased pressure to remove as much of the residual CMC 18 as possible.

In some embodiments, the settings for running the blade may be adjusted based on visual inspection. For example, after a first run of the blade if the excess CMC 18 is adequately removed then a second run of the blade may not be canceled. Or, if after a first run of the blade there is an unacceptable amount of excess CMC 18 still remaining then a second run of the blade may be initiated. In some embodiments, plasma descumming using a mixture of $O_2$ and $CF_4$ may also be used to remove a thin CMC 18 residue from the sure of photoresist molds 22.

Figure 7:
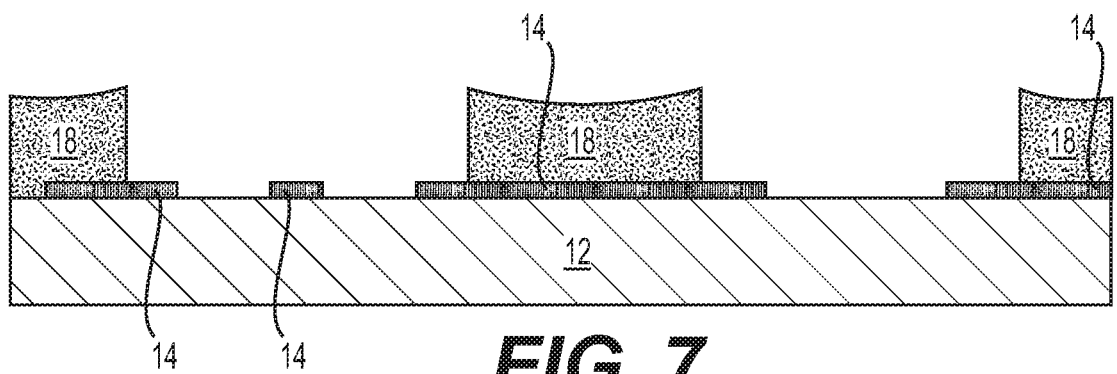
FIG. 7 is a cross-sectional illustration of another step of the method of manufacturing of FIG. 3.

After the CMC 18 has cured, next at step 108, method 100 may include removing positive photoresist mold 22 to reveal a cavity 24 defined by CMC 18, as shown in FIG. 7. In some embodiments, a solvent, alkaline solution, or other chemical solution may be used to remove positive photoresist mold 22. A variety of different solvents may be used, for example, acetone, N-Methyl-2-pyrrolidon (NMP), dimethyl sulfoxide (DMSO), or other like solvents. In some embodiments, sonication may be used to assist with removing positive photoresist mold 22. For example, sonication may be used to facilitate the dissolution of the residual CMC 18 on the surface of positive photoresist mold 22. In some embodiments, following step 108, another oxygen plasma treatment (e.g., a second oxygen plasma treatment) may be conducted.

Next at step 110, method 100 may include dispensing an anisotropic conductive paste (ACP) 26 into cavity 24. A variety of different anisotropic conductive pastes may be used. One example is DELOMONOPDX® AC268. In some embodiments, an epoxy or other type of adhesive may be used. In some embodiments, non-conductive epoxies may also be used.

During step 110, a variety of different aspects of the dispensing may be controlled (manually or automatically). For example, the one or more locations within cavity 24 where ACP 26 may be dispensed, the total volume of ACP 26 dispensed, the volume of ACP 26 dispensed at each location, the flow rate at which ACP 26 is dispensed. ACP 26 may be dispensed at one or more locations in a sufficient quantity such that ACP 26 completely underfills chip 16 and fills all available space not occupied by chip 16 once installed. In some embodiments, ACP 26 may be smeared into the gaps (e.g., between traces 14). ACP 26 may maintain flowability after dispensing into cavity 24 to enable ACP 26 to fill and seal any gaps.

Figure 8:
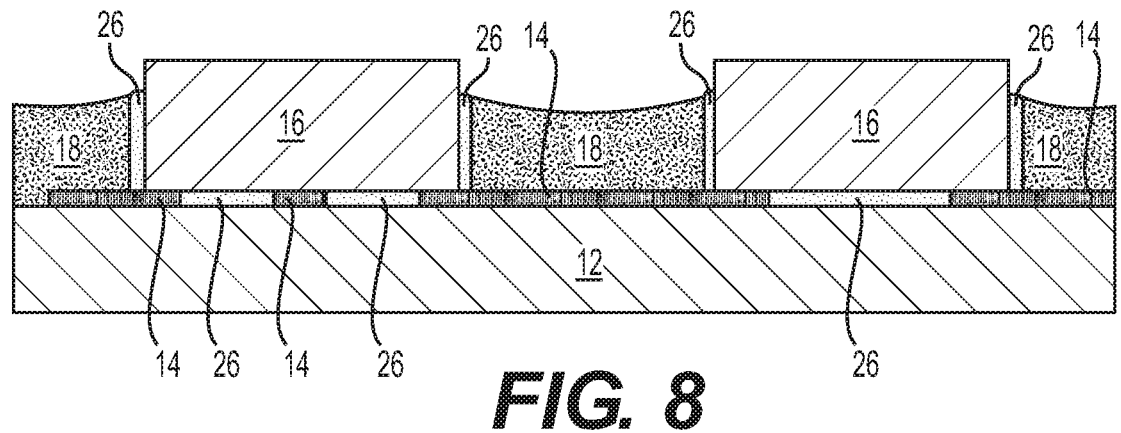
FIG. 8 is a cross-sectional illustration of another step of the method of manufacturing of FIG. 3.

Next at step 112, method 100 may include inserting chip 16 into cavity 24 and bonding chip 16 to metal traces 14, as shown in FIG. 8. The number of chips inserted and bonded may vary. For example, in some embodiments a single chip 16 may be inserted and bonded into a single cavity 24, while in some embodiments two or more chips 16 may be inserted and bonded into two or more cavities 24. Step 112 may utilize a variety of techniques to insert and bond chip 16. For example, in some embodiments, the technique of flip-chip bonding may be used to insert and bond chip 16 into cavity 24. As shown in FIG. 8, chip 16 may be inserted such that contact pads on chip 16 may contact corresponding metal traces 14 at the appropriate locations. In addition, as shown in FIG. 8, once inserted, ACP 26 may fill all the available space within cavity 24.

A second method 200 of manufacturing FEC 10 will now be explained with reference to FIGS. 9-14.

Figure 9:
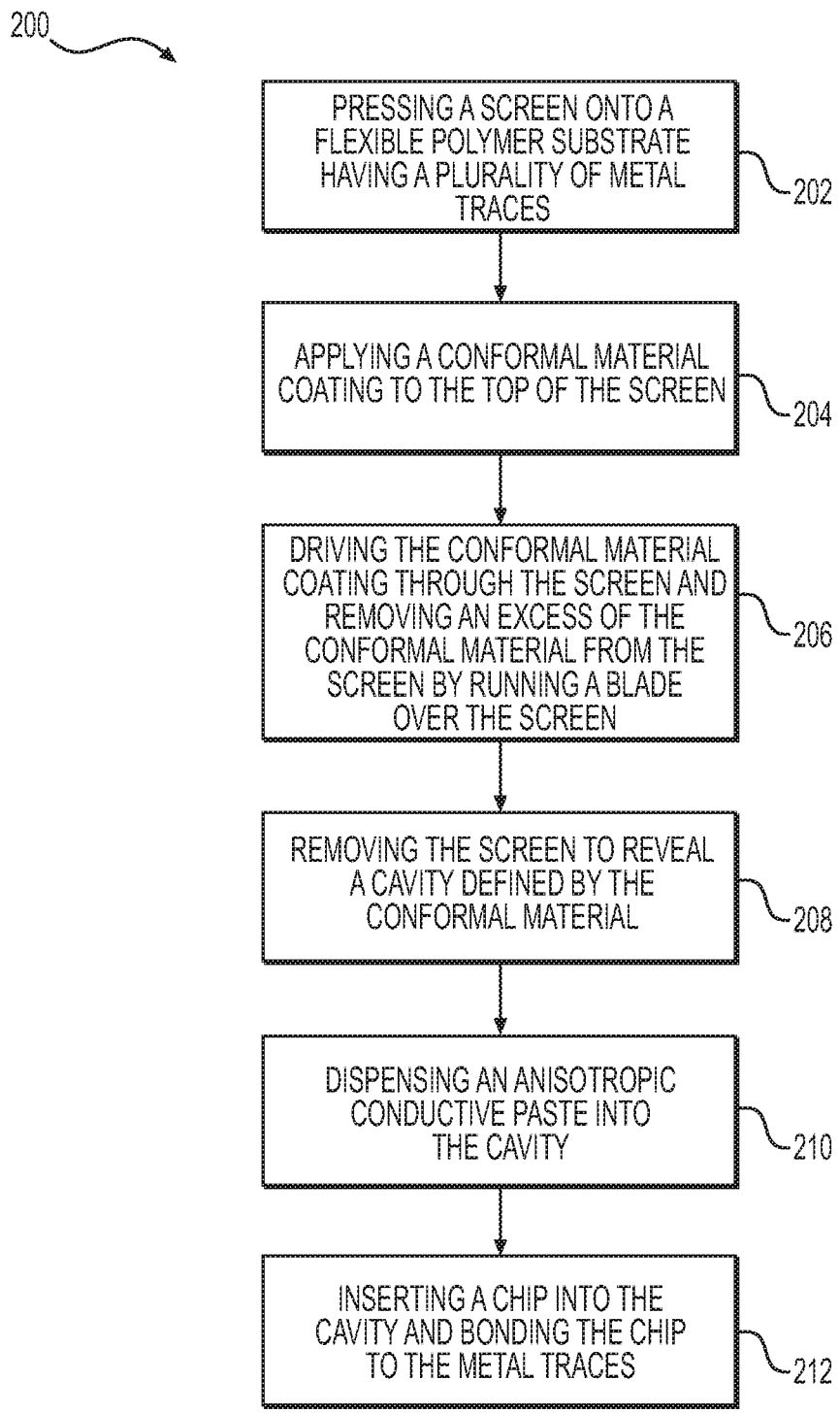
FIG. 9 is a flow chart illustrating another method of manufacturing the flexible electronic circuit of FIG. 1.
Figure 10:
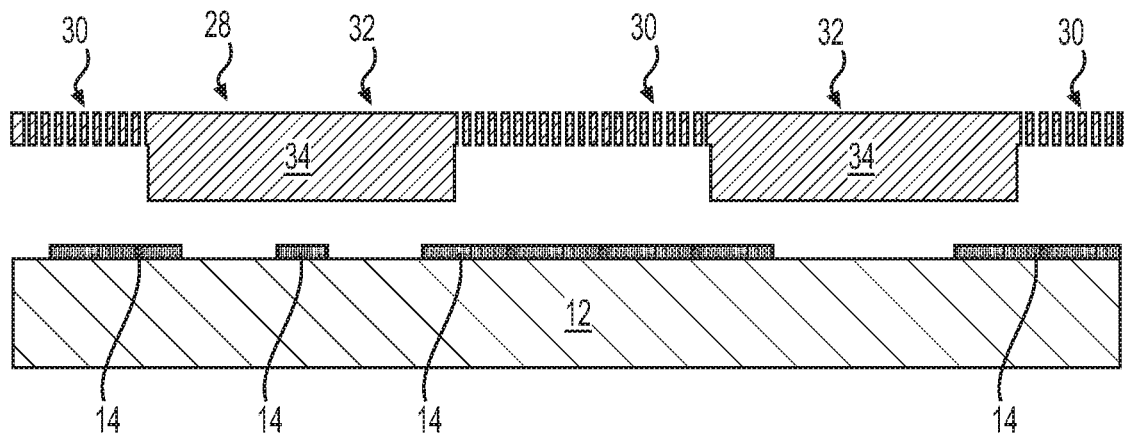
FIG. 10 is a cross-sectional illustration of a step of the method of manufacturing of FIG. 9.

FIG. 9 is a flow chart showing the steps of method 200. Method 200 may begin with flexible polymer substrate 12 having metal traces 14. Step 202 may include pressing a screen 28 onto flexible polymer substrate 12 having metal traces 14, as shown in FIG. 10. Portions of screen 28 may be porous while other portions are blocked (i.e., non-porous). For example, as shown in FIG. 10, screen 28 may have porous portions 30 and blocked portions 32. In some embodiments, there may be one or more porous portions 30 and/or one or more blocked portions 32. Porous portions 30 may be configured to allow the flow of a fluid through screen 28 while blocked portions 32 may prevent the flow of fluid through screen 28. As shown in FIG. 10 the thickness of screen 28 may vary. For example, the thickness of blocked portions 32 may be greater than that of porous portions 30. In some embodiments, blocked portions 32 may be configured to define molds 34. Screen 28 may be urged into firm contact with substrate 12 and metal traces 14. The firm contact can prevent or limit unintended smearing of CMC 18 (e.g., into the cavities intended for chips 16). The elevation of screen 28 relative to substrate 12 may determine the thickness of CMC 18. For example, adjusting (i.e., raising or lowering) the elevation of screen 28 may enable precise control over the thickness of CMC 18.

In some embodiments, similar to method 100, an oxygen plasma treatment may be conducted on the surface of substrate 12. The oxygen plasma treatment may create hydroxyl groups on the polymer surface.

Figure 11:
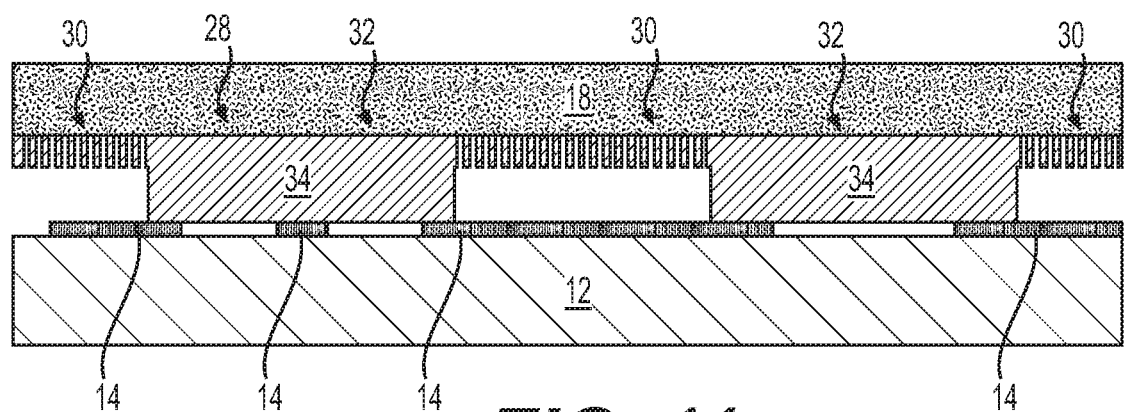
FIG. 11 is a cross-sectional illustration of another step of the method of manufacturing of FIG. 9.

Next at step 204, method 200 may include applying CMC 18 to the top of screen 28, as shown in FIG. 11. CMC 18 may be applied to screen 28 using a variety of suitable methods. For example, CMC 18 may be applied by spin coating, spray coating, dip coating, or slot-die coating. Other suitable methods may also be used or a combination of methods may be used. According to an exemplary embodiment, CMC 18 may be applied using the spin coating method.

Figure 12:
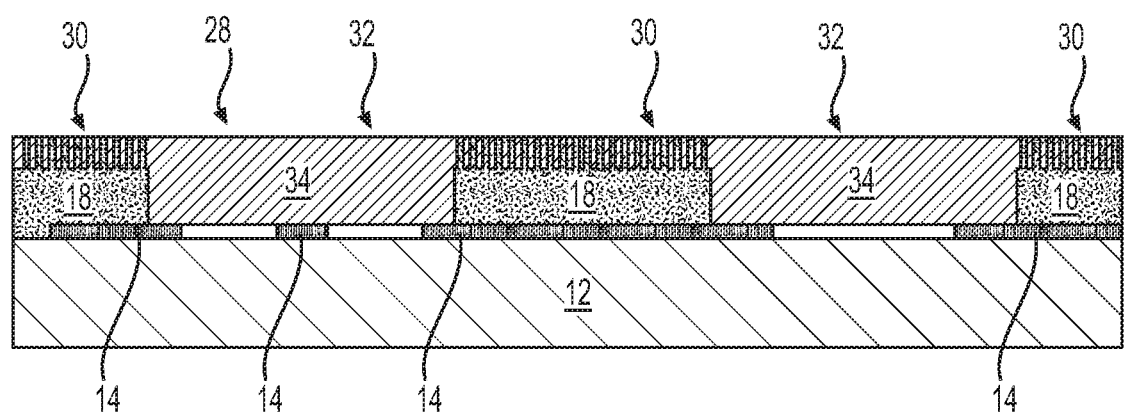
FIG. 12 is a cross-sectional illustration of another step of the method of manufacturing of FIG. 9.

Next at step 206, method 200 may include driving CMC 18 through screen 28 and removing an excess of CMC 18 from screen 28 by running a blade over screen 28. As shown in FIG. 12, CMC 18 may flow through porous portions 30 and fill in between blocked portions 32 up to the surface of screen 28.

In some embodiments, the blade used at step 206 for driving CMC 18 and removing the excess CMC 18 may be a squeegee like blade. The blade may be manually or automatically controlled. For example, in some embodiments a robotic system may control the blade. A variety of different aspects or settings of the blade control may be adjustable and controllable. For example, an angle of the blade and/or the pressure (i.e., downward force) being applied by the blade may be controllable. The direction, speed, path of the blade run, and number of passes may also be controllable in some embodiments. In some embodiments, the blade may be run just one time while in other embodiments the blade may be run multiple times. For embodiments where the blade is run multiple times the setting of the blade control may be adjusted between runs. For example, a first run of the blade may be used to drive CMC 18 while a second run may be to remove the majority of the excess CMC 18.

Figure 13:
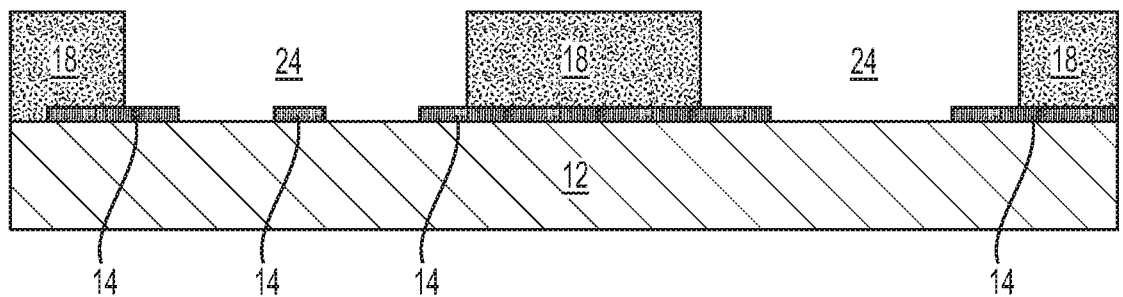
FIG. 13 is a cross-sectional illustration of another step of the method of manufacturing of FIG. 9.

Next at 208, method 200 may include removing screen 28 to reveal cavities 24 defined by CMC 18, as shown in FIG. 13. In some embodiments, prior to removing screen 28, CMC 18 may be allowed to partially cure, but screen 28 may be removed before CMC 18 fully cures. In some embodiments, following step 208, another oxygen plasma treatment (e.g., a second oxygen plasma treatment) may be conducted.

Next at step 210, method 200 may include dispensing an anisotropic conductive paste (ACP) 26 into cavity 24. Step 210 may be similar to step 110 of method 100. Like step 110, for step 210 a variety of different anisotropic conductive pastes may be used. One example is DELOMONOPDX® AC268. In some embodiments, an epoxy or other type of adhesive may be used.

Like step 110, during step 210 a variety of aspects of the dispensing may be controlled (manually or automatically). For example, the one or more locations within cavity 24 ACP 26 may be dispensed, the total volume of ACP 26 dispensed, the volume of ACP 26 dispensed at each location, the flow rate at which ACP 26 is dispensed. ACP 26 may be dispensed at one or more locations of a sufficient quantity such that ACP 26 completely underfills chips 16 and fills all available space not occupied by chip 16 once installed. In some embodiments, ACP 26 may be smeared into the gaps (e.g., between traces 14).

Figure 14:
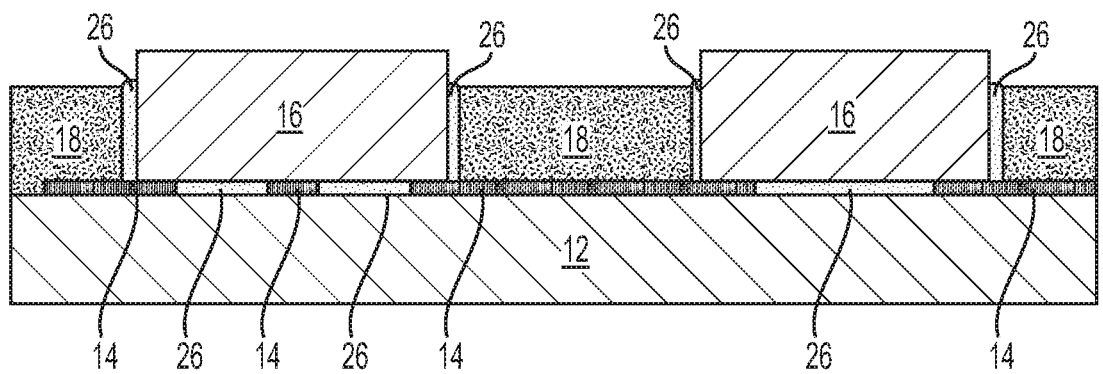
FIG. 14 is a cross-sectional illustration of another step of the method of manufacturing of FIG. 9.

Next at step 212, method 200 may include inserting chips 16 into cavities 24 and bonding chips 16 to metal traces 14. Step 212 may be similar to step 112 of method 100. Like step 112, for step 212 the number of chips inserted and bonded may vary. For example, in some embodiments a single chip 16 may be inserted and bonded into a single cavity 24, while in some embodiments two or more chips 16 may be inserted and bonded into two or more cavities 24. Step 212 may utilize a variety of techniques to insert and bond chip 16. For example, in some embodiments, the technique of flip chip bonding may be used to insert and bond chip 16 into cavity 24. As shown in FIG. 14, chip 16 may be inserted such that pads on chip 16 contact metal traces 14 at the appropriate locations. In addition, as shown in FIG. 14, once inserted, ACP 26 may fill all the available space within cavity 24.

Methods 100 and 200 are methods for manufacturing FEC 10, which enable precise control over the thickness of CMC 18. For example, as described herein, method 100 may enable control over the thickness of CMC 18 by adjusting the elevation of the blade relative to substrate 12 and/or positive photoresist molds 22. In yet another example, as described herein, method may enable control over the thickness of CMC 18 by adjusting the elevation of screen 28 relative to substrate 12. In some embodiments, the elevation of screen 28 may be adjusted relative to substrate 12 by adjusting the thickness of blocked portions 32 and mold 34. Enabling precise control over the thickness of CMC 18 enables greater control over the overall thickness of FEC 10, which can enable smaller and thinner flexible electronic circuits to be manufactured.

Methods 100 and 200 are also methods of manufacturing FEC 10, which enable select chips 16 to be exposed to the environment (i.e., not covered by CMC 18). In contrast to other known methods, methods 100 and 200 achieve this functionality without ablating CMC 18 from the surface of a chip or without masking the surface of a chip during the manufacturing, which may cause damage to the chip.

The foregoing description has been presented for purposes of illustration. It is not exhaustive and is not limited to precise forms or embodiments disclosed. Modifications and adaptations of the embodiments will be apparent from consideration of the specification and practice of the disclosed embodiments. For example, the described implementations include methods of manufacturing flexible electronic circuits, but the approaches may be used to manufacture other electronic circuits and components as well.

Moreover, while illustrative embodiments have been described herein, the scope includes any and all embodiments having equivalent elements, modifications, omissions, combinations (e.g., of aspects across various embodiments), adaptations and/or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps and/or inserting or deleting steps.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Words such as "and" or "or" mean "and/or" unless specifically directed otherwise. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

Other embodiments will be apparent from consideration of the specification and practice of the embodiments disclosed herein. It is intended that the specification and examples be considered as example only, with a true scope and spirit of the disclosed embodiments being indicated by the following claims.

The invention claimed is:

1. A method of manufacturing a flexible electronic circuit, comprising:
    forming a positive photoresist mold on a flexible polymer substrate having a plurality of metal traces;
    applying a conformal material coating over the positive photoresist mold, the flexible polymer substrate, and the metal traces;
    removing an excess of the conformal material coating by running a blade across the conformal material coating, over the positive photoresist mold;
    removing the positive photoresist mold to reveal a cavity defined by the conformal material coating;

dispensing an anisotropic conductive paste into the cavity; and after removing the positive photoresist mold and after dispensing the anisotropic conductive paste into the cavity, inserting a chip into the cavity and bonding the chip to the metal traces, such that a portion of the chip is exposed to a surrounding environment and the conformal material coating has a thickness that is less than or equal to a thickness of the chip.

2. The method of claim 1, further comprising treating the flexible polymer substrate with oxygen plasma to produce hydroxyl groups on a surface of the polymer substrate.

3. The method of claim 2, wherein a first oxygen plasma treatment is conducted prior to applying the conformal material coating and a second oxygen plasma treatment is conducted after removing the positive photoresist mold.

4. The method of claim 1, wherein the conformal material coating is silicone.

5. The method of claim 1, wherein the conformal material coating is applied by at least one of spin coating, spray coating, dip coating, and slot-die coating.

6. The method of claim 1, wherein the blade is a squeegee-like blade having a generally smooth elastomer edge that is deflectable and the edge is run over the positive photoresist mold at an elevation that substantially corresponds to an elevation of a top surface of the positive photoresist mold.

7. The method of claim 1, wherein acetone is used to remove the positive photoresist mold.

8. The method of claim 1, wherein sonication is used to assist with removing the positive photoresist mold.

9. The method of claim 1, wherein the anisotropic conductive paste fills between the metal traces and any gaps between the chip and walls of the cavity formed by the conformal material coating.

10. A method of manufacturing a flexible electronic circuit, comprising:
pressing a screen onto a flexible polymer substrate having a plurality of metal traces, wherein the screen has a porous portion and a blocked portion, and the blocked portion defines a mold;

applying a conformal material coating to a top of the screen enabling the conformal material to flow through the porous portion of the screen filing around the mold;

driving the conformal material coating through the screen and removing an excess of the conformal material from the screen by running a blade over the screen;

removing the screen to reveal a cavity defined by the conformal material coating;

dispensing an anisotropic conductive paste into the cavity; and after removing the screen and after dispensing the anisotropic conductive paste into the cavity, inserting a chip into the cavity and bonding the chip to the metal traces.

11. The method of claim 10, further comprising treating the flexible polymer substrate with oxygen plasma to produce hydroxyl groups on a surface of the polymer substrate.

12. The method of claim 10, wherein a first oxygen plasma treatment is conducted prior to applying the conformal material coating and a second oxygen plasma treatment is conducted after removing the screen.

13. The method of claim 10, wherein the conformal material coating is silicone.

14. The method of claim 10, wherein the conformal material coating is applied by at least one of spin coating, spray coating, dip coating, and slot-die coating.

15. The method of claim 10, wherein the anisotropic conductive paste fills between the metal traces and any gaps between the chip and walls of the cavity formed by the conformal material coating.

16. The method of claim 10, wherein after removing the screen and after dispensing the anisotropic conductive paste into the cavity, inserting a chip into the cavity and bonding the chip to the metal traces comprises inserting the chip into the cavity, such that a portion of the chip is exposed to a surrounding environment and the conformal material coating has a thickness that is less than or equal to a thickness of the chip.

* * * * *